(12) United States Patent
Iwasaki et al.

(10) Patent No.: US 6,636,399 B2
(45) Date of Patent: Oct. 21, 2003

(54) MAGNETORESISTANCE EFFECT DEVICE, MAGNETIC HEAD THEREWITH, MAGNETIC RECORDING/REPRODUCING HEAD, AND MAGNETIC STORING APPARATUS

(75) Inventors: Hitoshi Iwasaki, Yokosuka (JP); Yuzo Kamiguchi, Yokohama (JP); Hiromi Fuke, Kawasaki (JP); Kazuhiro Saito, Yokohama (JP); Masashi Sahashi, Yokohama (JP)

(73) Assignee: Kabushiki Kaishia Toshiba, Kawasaki (JP)

( * ) Notice: Subject to any disclaimer, the term of this patent is extended or adjusted under 35 U.S.C. 154(b) by 0 days.

(21) Appl. No.: 09/927,364

(22) Filed: Aug. 13, 2001

(65) Prior Publication Data

US 2002/0015269 A1 Feb. 7, 2002

Related U.S. Application Data

(62) Division of application No. 09/837,373, filed on Apr. 19, 2001, which is a continuation of application No. 08/916,396, filed on Aug. 22, 1997, now abandoned.

(30) Foreign Application Priority Data

Aug. 26, 1996 (JP) .......................................... P8-223481

(51) Int. Cl.[7] .............................................. G11B 5/139
(52) U.S. Cl. ................................................ 360/324.12
(58) Field of Search ..................... 360/324.12; 428/611; 324/252, 207.21

(56) References Cited

U.S. PATENT DOCUMENTS

| | | | |
|---|---|---|---|
| 5,343,422 A | 8/1994 | Kung et al. | 360/113 X |
| 5,608,593 A | 3/1997 | Kim et al. | 360/113 |
| 5,739,987 A | 4/1998 | Yuan et al. | 360/113 |
| 5,739,990 A | 4/1998 | Ravipati et al. | 360/113 |
| 5,761,011 A | 6/1998 | Miyauchi et al. | 360/113 |
| 5,772,794 A | 6/1998 | Uno et al. | 360/113 X |
| 5,796,560 A | 8/1998 | Saito et al. | 360/113 |
| 5,849,422 A | * 12/1998 | Hayashi | 428/469 |
| 5,859,753 A | * 1/1999 | Ohtsuka et al. | 360/314 |
| 5,949,622 A | 9/1999 | Kamiguchi et al. | 360/113 |
| 6,111,729 A | 8/2000 | Kamiguchi et al. | 360/324.1 |

* cited by examiner

Primary Examiner—George J. Letscher
(74) Attorney, Agent, or Firm—Finnegan, Henderson, Farabow, Garrett & Dunner, L.L.P.

(57) ABSTRACT

A magnetoresistance effect device comprises a magnetic multi-layer film having at least an antiferromagnetic film, a first ferromagnetic film, a non-magnetic film, and a second ferromagnetic film formed in the order on the front surface portion of the substrate, the magnetic multi-layer film having giant magnetoresistance effect, at least the second ferromagnetic film having a shape corresponding to a magnetic field detecting portion. The bias magnetic field applying films are disposed on a conductive film of the magnetic multi-layer film at outer portions of both edge portions of the magnetic field detecting portion of the magnetoresistance effective film. Alternatively, the second ferromagnetic film has a first portion corresponding to the magnetic field detecting portion and a second portion corresponding to the outer portions of both the edge portions of the magnetic field detecting portion, the film thickness-of the second portion being smaller than the film thickness of the first portion. The bias magnetic field applying films are formed at the outer portions of both the edge portions of the magnetic field detecting portion of the second ferromagnetic film. With the reversely structured magnetoresistance effect film and the laminate positions of the bias magnetic field applying films, in addition to suppressing the reproduction fringe and Barkhausen noise, the decrease of contact resistance, the suppression of insulation detect, and good linear response characteristic can be accomplished.

24 Claims, 7 Drawing Sheets

MAGNETORESISTANCE EFFECT DEVICE, MAGNETIC HEAD THEREWITH, MAGNETIC RECORDING/REPRODUCING HEAD, AND MAGNETIC STORING APPARATUS

This is a division of Application No. 09/837,373, filed Apr. 19, 2001, which is a continuation of Application No. 08/916,396, filed Aug. 22, 1997, now abandoned, all of which are incorpoated herein by reference.

BACKGROUND OF THE INVENTION

1. Field of the Invention

The present invention relates to a magnetoresistance effect device composed of a magnetic multi-layer film having giant magnetoresistance effect, a magnetic head therewith, a magnetic recording/reproducing head therewith, and a magnetic storing apparatus therewith.

2. Description of the Related Art

In magnetic recording apparatuses such as a HDD (Hard Disk Drive), the record track width is being decreased so as to increase the record density. To compensate the decrease of the reproduced output due to the decrease of the record track width, a magnetic head having a high sensitive magnetoresistance effect device (MR device) is being required. In particular, an MR head having a spin valve film with giant magnetoresistance effect is hopeful as a successor. The spin valve film is composed of a magnetic multi-layer having a ferromagnetic film whose magnetization rotates corresponding to a signal magnetic field (this film is hereinafter referred to as a magnetization free layer), a non-magnetic film, a ferromagnetic film whose magnetization is fixed with a bias magnetic field of an antiferromagnetic film (this ferromagnetic film is hereinafter referred to as a fixed magnetization layer), and an antiferromagnetic layer that fixes the magnetization of the fixed magnetization layer.

In an MR head having the spin valve film, there are large practical problems of Barkhausen noise causes by a magnetic domain wall of the magnetization free layer and a reproduction fringe in the vicinity of both edge portions of a reproduction track. To solve these problems, as shown a cross section diagram viewed from direction opposite to a medium in FIG. 12, a so-called abutted junction type MR head of which outer portions of both edge portions 1a and 1a of a record track width of a spin valve film 1 are etched out and instead hard magnetic films 2 are disposed thereto has been proposed.

The spin valve film 1 shown in FIG. 12 has a magnetization free layer 4, a non-magnetic film 5, a fixed magnetization layer 6, and an antiferromagnetic film 7 that are formed in the order on a substrate 3. In addition, a pair of electrodes (reproduction electrodes) 8 that supply a sense current to the spin valve film 1 are formed on the hard magnetic film 2.

In the MR head of abutted junction type shown in FIG. 12, a bias magnetic field of the hard magnetic film 2 causes a magnetic domain of the magnetization free layer 4 to disappear, thereby suppressing Barkhausen noise. In addition, since a portion other than the record track width is substituted with the hard magnetic film 2, only record information can be read-from record track. Thus, the reproduction fringe can be remarkably reduced.

However, the MR head having the spin valve film I of the abutted junction type has the following problems. Firstly, a gap film (not shown) composed of a non-magnetic insulator such as alumina is disposed below the spin valve film 1. Thus, the reproduction electrode 8 and the hard magnetic film 2 contact a wall surface of the spin valve film 1 that has been etched out. Consequently, the contact resistance increases or becomes unstable.

Secondly, when the magnetization free layer 4 at both the edge portions of the spin valve film 1 is etched out, since the magnetization free layer 4 is disposed at the bottom position, the gap film tends to be excessively etched out. Thus, an insulation defect of a magnetic shield layer disposed below the gap film tends to take place.

Thirdly, when the spin valve film is etched out, the lower portion of the spin valve film 1 is lesser tapered than the upper portion thereof. Thus, an exchange-coupled region of the hard magnetization film 2 and the magnetization free layer 4 increases in the taper portion. In the taper portion, since the exchange-coupled force is unstable, Barkhausen noise tends to take place.

Fourthly, since the edge wall surface of the hard magnetic film 2 inevitably contacts the edge wall surface of the fixed magnetization layer 6, the bias magnetic field of the hard magnetic film 2 is applied to the fixed magnetization layer 6. Thus, the magnetization of the fixed magnetization layer 6 to be fixed in the direction of the width of the spin valve film 1 (in the direction to which the signal magnetic field is applied) is inclined to the direction of the bias of the hard magnetic film 2 (the longitudinal direction of the spin valve film 1). Consequently, a good linear response to the signal magnetic field can not be obtained.

In addition, another MR head has been proposed. in this MR head, a bias magnetic field applying film such as a hard magnetic film and an antiferromagnetic film is directly layered on edge portions of an MR film so as to exchange-couple them. Thus, Barkhausen noise is removed. However, in the conventional spin valve film of which a fixed magnetization layer or the like is disposed on a magnetization free layer, a hard magnetic film and an antiferromagnetic film should be disposed on the substrate side. When these films are patterned, the surface characteristic of a base film of the spin valve film deteriorates.

In particular, to stably exchange-couple the hard magnetic film and the antiferromagnetic film with the magnetization free layer, the film thickness of the hard magnetic film and the antiferromagnetic film should be increased. In the case that these films are thick, when they are patterned, the surface characteristic of the base layer of the spin valve film inevitably deteriorates. In addition, with the antiferromagnetic film, it is difficult to obtain a strong exchange bias. With the hard magnetic film, coercive force decreases due to the reaction of the magnetization free layer. Thus, the magnetization cannot be stably fixed at the edge portions of the track width. Consequently, the decrease of reproduction fringe and the suppression of Barkhausen noise are insufficient.

As described above, with the MR head having the conventional spin valve of the abutted junction type, the contact resistance increases or becomes unstable due to the shape thereof. Insulation defect and unstable exchange coupling of the hard magnetic film and magnetization free layer tend to take place. In addition, since the magnetization of the fixed magnetization layer is inclined, a good linear response to a signal magnetic field cannot be obtained.

On the other hand, with the MR head of which the bias magnetic field applying film such as a hard magnetic film and an antiferromagnetic film is directly layered on a spin valve film, the surface characteristic of the base film of the spin valve film deteriorates. Moreover, the magnetization cannot be stably fixed at the edge portions of the track width. Thus, the decrease of reproduction fringe and the suppression of Barkhausen noise are insufficient.

Furthermore, a magnetic storing apparatus such as a magnetoresistance effect random access memory (MRAM) having a spin valve film has been studied. In this case, a sufficient bias is required.

SUMMARY OF THE INVENTION

Thus, an object of the present invention is to provide a magnetoresistance effect device that suppresses reproduction fringe and Barkhausen noise and that accomplishes the decrease of contact resistance, suppression of insulation defect, and good linear response. Another object of the present invention is provide a magnetic head having the magnetoresistance effect device so as to improve characteristics, a magnetic recording/reproducing head thereof, and a magnetic storing apparatus thereof.

A first aspect of the present invention is a magnetoresistance effect device, comprising a substrate having a main surface, a magnetoresistance effect film composed of a magnetic multi-layer film having at least an antiferromagnetic film, a first ferromagnetic film, a non-magnetic film, and a second ferromagnetic film formed in the order above the main surface portion of the substrate, the magnetic multi-layer film having giant magnetoresistance effect, the second ferromagnetic film disposed in a magnetic field detecting portion, a pair of bias magnetic field applying films adjacent to the both edge portions of the magnetic field detecting portion, the bias magnetic field applying films disposed on a conductive film selected from the group consisting of the antiferromagnetic film, the first ferromagnetic film, and the non-magnetic film, and a pair of electrodes for supplying a current to the magnetoresistance effect film.

A second aspect of the present invention is a magnetoresistance effect device, comprising a substrate having a main surface, a magnetoresistance effect film composed of a magnetic multi-layer film having at least an antiferromagnetic film, a first ferromagnetic film, a non-magnetic film, and a second ferromagnetic film formed in the order above the main surface of the substrate, the magnetic multi-layer film having giant magnetoresistance effect, the second ferromagnetic film having a first portion corresponding' to a magnetic field detecting portion and a second portion corresponding to outer portions of both edge portions of the magnetic field detecting portion, the film thickness of the second portion being smaller than the film thickness of the first portion, a pair of bias magnetic field applying films disposed on the second ferromagnetic film at the outer portions of both the edge portions of the magnetic field detecting portion, and a pair of electrodes for supplying a current to the magnetoresistance effect films.

A third aspect of the present invention is a magnetoresistance effect device, comprising a substrate having a main surface, a magnetoresistance effect film composed of a magnetic multi-;-layer film having at least an antiferromagnetic film, a first ferromagnetic film, a non-magnetic film, and a second ferromagnetic film formed in the order above the main surface of the substrate, the magnetic multi-layer film having giant magnetoresistance effect, the magnetoresistance effect film having a magnetic field detecting portion, a pair of bias magnetic field applying films formed on the second ferromagnetic film at outer portions of both edge portions of the magnetic field detecting portion of the magnetoresistance effect film, and a pair of electrodes for supplying a current to the magnetoresistance effect film.

A fourth aspect of the present invention is a magnetic head, comprising a lower magnetic shield layer, the magnetoresistance effect device of the present invention, said magnetoresistance effect device being formed on said lower magnetic shield layer through a lower reproduction magnetic gap, and an upper magnetic shield layer formed on the magnetoresistance effect device through an upper reproduction magnetic gap.

A fifth aspect of the present invention is a magnetic recording/reproducing head, comprising a reproducing head having the magnetoresistance effect head of the present invention, and recording head having a lower magnetic pole in common with the lower magnetic shield layer of the magnetoresistance effect head, a record magnetic gap formed on the lower magnetic pole, and an upper magnetic pole formed on the record magnetic gap.

A sixth aspect of the present invention is a magnetic storing apparatus, comprising the magnetoresistance effect device of the present invention, a write electrode for storing information to a magnetoresistance effect film of the magnetoresistance effect device, and a read electrode, composed of an electrode of the magnetoresistance effect device, for reproducing information stored in the magnetoresistance effect film.

According to the magnetoresistance effect device of the first aspect of the present invention, the first ferromagnetic film is disposed on the substrate side. The antiferromagnetic film applies a bias magnetic field to the first ferromagnetic film so as to fix the magnetization thereof. The second ferromagnetic films are-disposed as the magnetization free layers on the opposite side of the substrate. Thus, the second ferromagnetic films on the outer portions of both the edge portions of the magnetic field detecting portion are removed. Consequently, a good off-track characteristic (low reproduction fringe) is obtained. In addition, a part of a conductive film of the magnetic multi-layer film is left at the outer portions of both the edge portions of the magnetic field detecting portion (reproduction track) is accomplished. Thus, an electric contact can be secured.

In addition, since a taper region that causes the antiferromagnetic film and the second ferromagnetic film to be unstably exchange-coupled can be decreased, Barkhausen noise can be stably suppressed. Moreover, a bias magnetic field can be applied to the second ferromagnetic film without need to contact the edge wall surfaces of the edge portions of the first ferromagnetic film that is the fixed magnetization layer with the bias magnetic field applying film. Thus, in addition to suppressing Barkhausen noise, a good linear response characteristic can be obtained.

According to the magnetoresistance effect head of the second aspect of the present invention, the first ferromagnetic film is disposed on the substrate side. The antiferromagnetic film applies a bias magnetic field to the first ferromagnetic film so as to fix the magnetization thereof. The second ferromagnetic films are disposed as the magnetization free layers on the opposite side of the substrate. Thus, when the bias magnetic field applying film is patterned, the surface characteristic of the base film of the spin valve film does not deteriorate. Consequently, stable characteristics of the spin valve film can be accomplished.

In addition, the film thickness of the second ferromagnetic film at the outer portions of both the edge portions of the magnetic field detecting portion is smaller than the film thickness of the second ferromagnetic film at the magnetic field detecting portion. Thus, with the bias magnetic field applying films composed of an antiferromagnetic film, the increase of exchange bias force can be expected. on the other hand, with the bias magnetic field applying films composed of a hard magnetic film, the increase of coercive force can be expected. Consequently, the magnetization of the second ferromagnetic film at the outer portions of both the edge portions of the magnetic field detecting portion is more stably fixed. Thus, in addition to suppressing Barkhausen noise, a good off-track characteristic (low reproduction fringe) can be obtained. Moreover, since the direction of the magnetization of the first ferromagnetic film that is the fixed magnetization film is not disturbed, a good linear response characteristic can be accomplished.

According to the magnetoresistance effect head of the third aspect of the present invention, the first ferromagnetic film is disposed on the substrate side. The antiferromagnetic film applies a bias magnetic field to the first ferromagnetic film so as to fix the magnetization thereof. The second ferromagnetic films are disposed as the magnetization free layers on the opposite side of the substrate. Thus, when the bias magnetic field applying film is patterned, the surface characteristic of the base film of the spin valve film does not deteriorate. Consequently, stable characteristics of the spin valve film can be accomplished.

In addition, since the film thickness of the second ferromagnetic film is decreased, with the bias magnetic field applying film composed of an antiferromagnetic film, the increase of the exchange bias force can be expected. On the other hand, with the bias magnetic field applying film composed of a hard magnetic film, the increase of the coercive force can be expected. Thus, the magnetization of the second ferromagnetic film at the outer portions of both the edge portions of the magnetic field detecting portion is stably fixed. Consequently, in addition to suppressing Barkhausen noise, a good off-track characteristic (low reproduction fringe) can be-obtained. Moreover, since the direction of the magnetization of the first ferromagnetic film that is the fixed magnetization layer is not disturbed, a good linear response characteristic can be accomplished.

These and other objects, features and advantages of the present invention will become more apparent in light of the following detailed description of best mode embodiments thereof, as illustrated in the accompanying drawings.

DESCRIPTION OF PREFERRED EMBODIMENTS

Next, embodiments of the present invention will be described.

Figure 1:
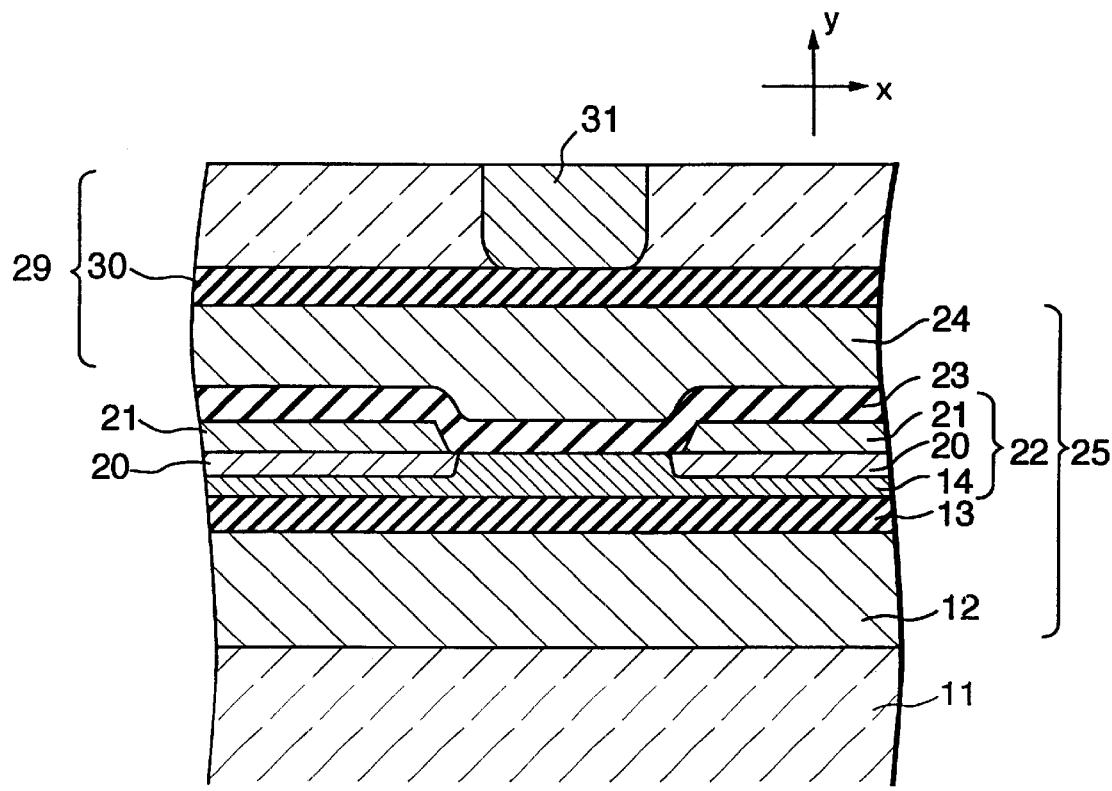
FIG. 1 is a sectional view showing the structure of a record/reproduction separate type magnetic head of which a magnetoresistance effect device according to a first embodiment of the preset invention is applied to a reproducing device portion thereof.
Figure 2:
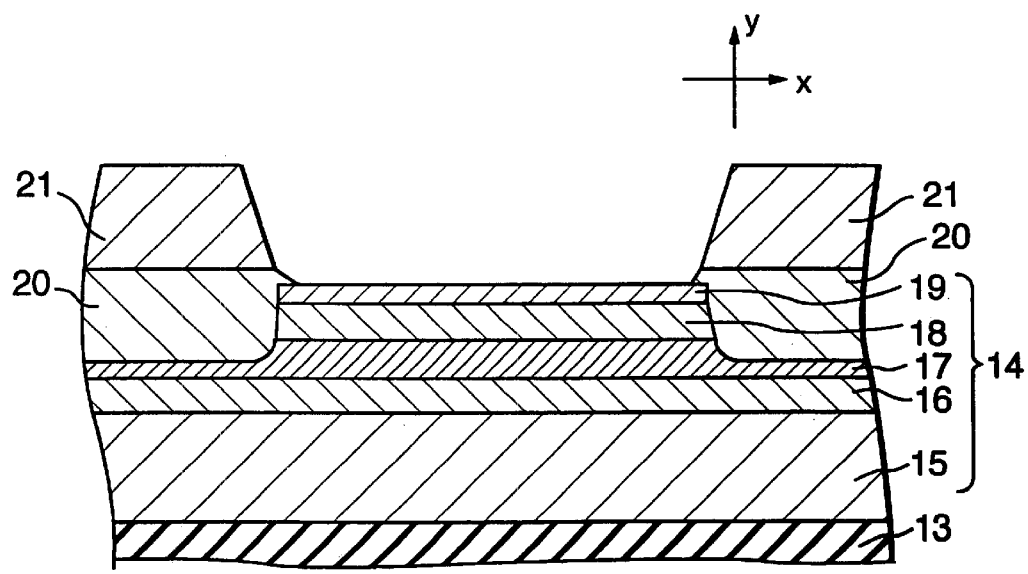
FIG. 2 is an enlarged sectional view showing the magnetoresistance effect device according to the first embodiment of the present invention.

FIGS. 1 and 2 show the structure of a record/reproduction separation type magnetic head of which a magnetoresistance effect device according to a first embodiment of the present invention is applied to a reproducing device portion thereof. FIG. 1 is a sectional view of which the record/reproduction separation type magnetic head is viewed from the direction opposite to a medium (the x direction accords with the direction of the width of the record track; the y direction accords with the traveling direction of the record track and the direction of the film thickness of the magnetoresistance effect device). FIG. 2 is an enlarged sectional view of principal portions of the record/reproduction separation type magnetic head.

In FIG. 1, reference numeral 11 is a substrate. An example of the substrate 11 is an $Al_2O_3 \cdot TiC$ substrate having an $Al_2O_3$ layer. A lower magnetic shield layer 12 is formed on the main front surface of the substrate 11. The lower magnetic shield layer 12 is composed of a soft magnetic material such as NiFe alloy, FeSiAl alloy, or amorphous CoZrNb alloy. A magnetoresistance effect film (GMR film) 14 that has giant magnetoresistance effect is formed on the lower magnetic shield layer 12 through a lower reproduction magnetic gap 13 composed of a non-magnetic insulation material such as $AlO_x$.

As shown in FIG. 2, the magnetic multi-layer film that composes the GMR film 14 has at least an antiferromagnetic film 15, a first ferromagnetic film 16, a non-magnetic film 17, and a second ferromagnetic film 18 that are formed in the order on the lower reproduction magnetic gap 13. The GMR film 14 is a so-called spin valve GMR film. The first ferromagnetic film 16 of the magnetic multi-layer film that composes the spin valve GMR film is a fixed magnetization layer of which the magnetization thereof is fixed with a bias magnetic field of the antiferromagnetic film 15 formed below the first ferromagnetic film 16. On the other hand, the second ferromagnetic film 18 is a magnetization free layer whose magnetization rotates corresponding to an external magnetic field such as a signal magnetic field. In FIG. 2, reference numeral 19 is a protection film composed of Ta or Ti. The protection film is formed when necessary.

The magnetization of the first ferromagnetic film 16 is preferably fixed nearly in the direction perpendicular (the direction perpendicular to the paper surface) to the opposite surface of the medium (the direction parallel to the paper surface) by the antiferromagnetic film 15. The magnetization of the second ferromagnetic film 18 is preferably oriented nearly in the direction of the track width when the intensity of the external magnetic field is 0. In other words, the direction of the magnetization of the first ferromagnetic film 16 is preferably perpendicular to the direction of the magnetization of the second ferromagnetic film 18. The second ferromagnetic film 18 is oriented nearly in the direction of the track width with the bias magnetic field of a pair of hard magnetic films 20 (that will be described later) when the intensity of the external magnetic field is 0. The bias magnetic field causes the magnetic domain to disappear.

Examples of the material of these ferromagnetic films 16 and 18 are Co, a CoFe alloy, CoFeB alloy, NiFe alloy, CoNi alloy, and NiFeCo alloy. To accomplish heat resistance of the recording portion forming process and long time reliability of resistance change ratio, a Co based alloy such as CoFe is preferably used. The film thickness of the first ferromagnetic film 16 is preferably in the range from 0.5 to 10 nm. The film thickness of the second ferromagnetic film 18 is preferably in the range from 1 to 20 nm.

The non-magnetic film 17 composed of Cu, Au, Ag, or an alloy thereof is disposed between the first ferromagnetic film 16 and the second ferromagnetic film 18. Basic elements of the spin valve GMR film 14 are the layers 15, 16, 17, and 18. The film thickness of the non-magnetic film 17 is preferably in the range from 0.5 to 10 nm. The antiferromagnetic film 15 is composed of IrMn alloy, RhMn alloy, RuMn alloy, PdPtMn alloy, CrMnPt alloy, FeMn alloy, NiMn alloy, PtMn alloy (that are conductive materials), NiO or CoO (that are insulation materials).

The spin valve GMR film 14 composed of the magnetic multi-layer film has the shape corresponding to the magnetic field detecting portion (reproduction track) from which at least the second ferromagnetic film 18 detects the external magnetic field such as the signal magnetic field. In other words, at least the second ferromagnetic film 18 has the shape of which the portions corresponding to the outer portions of both the edge portions of the record track width are removed so that the length in the x direction of the second ferromagnetic film 18 accords with a predetermined track width. The removing range of the magnetic multi-layer film in the direction of the film thickness is designated so that a conductive film of the magnetic multi-layer film is present at the top positions of the outer portions of both the edge portions of the reproduction track. The conductive film disposed at the top portions of the outer portions of both the edge portions of the reproduction tracks is the non-magnetic film 17 and the first ferromagnetic film 16. When IrMn alloy or FeMn alloy that are conductive materials is used for the antiferromagnetic film 15, the antiferromagnetic film 15 may be a conductive film disposed at the top positions.

To dispose a conductive film other than the second ferromagnetic film 18 at the outer portions of both the edge portions of the reproduction track, the magnetic multi-layer film formed by the spatter method or the like is ion-milled with a resist mask and at least the second ferromagnetic film 18 is removed. FIG. 2 shows the state that the magnetic multi-layer film is etched out in such a manner that a part of the non-magnetic film 17 is left. A part of the non-magnetic film 17 is left at the top positions of the outer portions of both the edge portions of the reproduction track.

At least, the second ferromagnetic film 18 is removed. A pair of hard magnetic films 20 are formed as the bias magnetic field applying films on the conductor film of the magnetic multi-layer film corresponding to the outer portions of both the edge portions of the reproduction track. The non-magnetic film 17 is contact with the hard magnetic films 20. Examples of the material of the pair of hard magnetic films 20 are a conductive hard magnetic material such as CoPt alloy or CoNiCr alloy. The film thickness of the hard magnetic films 20 is preferably in the range from 10 to 80 nm. A pair of electrodes 21 composed of Cu, Au, Zr, or Ta are formed on the pair of hard magnetic films 20. The pair of electrodes 21 supply a sense current to the spin valve GMR film 14. The distance between the electrodes 21 and 21 may be smaller than the distance between the hard magnetic films 20.

The spin valve GMR film 14, the pair of hard magnetic films 20, and the pair of electrodes 21 compose the GMR reproducing device 22. As shown in FIG. 1, an upper magnetic shield layer 24 is formed on the GMR reproducing device 22 through an upper reproduction magnetic gap 23. The upper magnetic shield layer 24 is composed of the same soft magnetic material as the lower magnetic shield layer 12. The upper reproduction magnetic gap 23 is composed of the same nonmagnetic insulation material as the lower reproduction magnetic gap 13. These layers compose a shield type GRM head 25 as a reproducing head.

Figure 3:
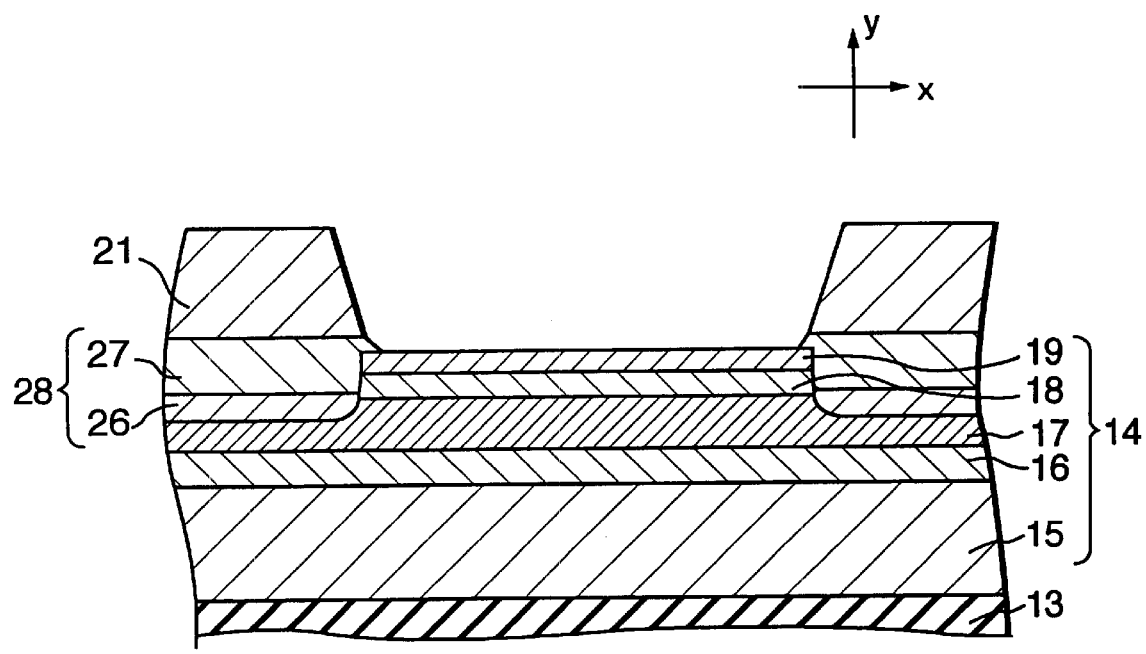
FIG. 3 is a sectional view showing a first modified example of the magnetoresistance effect device shown in FIG. 2.

The bias magnetic field applying film is not limited to the hard magnetic film 20. Instead, as shown the first modified example in FIG. 3, the bias magnetic applying film may be a laminate film 28 of which an antiferromagnetic film 27 is formed on a ferromagnetic film 26. In this case, the ferromagnetic film 26 and the antiferromagnetic film 27 may be reversely formed. The ferromagnetic film 26 is composed of for example NiFe alloy or Co based alloy. The antiferromagnetic film 27 is composed of for example NiMn alloy, FeMn alloy, IrMn alloy, or PtMn alloy. A strong unidirectional exchange-coupling bias magnetic field of the antiferromagnetic film 27 securely fixes the magnetization of the ferromagnetic film 26. Thus, the laminate film 28 functions as a bias magnetic field applying film that is the same as the hard magnetic film 20.

The direction of the bias magnetic field of the antiferromagnetic film 27 of the bias magnetic field applying film is preferably perpendicular to the direction of the bias magnetic field of the ferromagnetic film 15 of the spin valve GMR film. For example, the antiferromagnetic film 27 and the antiferromagnetic film 15 are selected so that their blocking temperatures are different from each other. When they are heat-treated in a magnetic field, the bias magnetic field directions thereof become perpendicular to each other. The blocking temperature can be varied corresponding to material, composition, film forming condition, and so forth. Next, an example of the conditions of heat-treatment in a magnetic field will be described.

For the antiferromagnetic film 27, IrMn alloy (with a film thickness of 5.5 nm) whose blocking temperature is 503 K is used. For the antiferromagnetic film 15, PtMn alloy whose blocking temperature is 653 K is used. First of all, the antiferromagnetic film 27 and the antiferromagnetic film 15 are left in an unidirectional magnetic field (with a coercive force of several 10 Oe) perpendicular to the medium at a temperature of 523 K for five hours. Thus, the magnetization of the antiferromagnetic film 15 is fixed in the direction perpendicular to the medium opposite surface. Next, in a cooling step, the direction of the magnetization is rotated in the direction of the track width for around 900 at an intermediate temperature (513 K or higher) of the blocking temperatures of the antiferromagnetic film 27 and the antiferromagnetic film 15. Thus, in the cooling step, the bias magnetic field of the antiferromagnetic film 27 causes the magnetization of the ferromagnetic film 26 to be fixed in the direction of the track width.

As shown in FIG. 1, a thin film magnetic head 29 is formed as a recording head on the shield type GMR head 25. A lower recording magnetic pole of the thin film magnetic head 29 is composed of the same magnetic layer as the upper magnetic shield layer 24. In other words, the upper magnetic shield layer 24 of the shield type MR head 25 is common with the lower recording magnetic pole of the thin film magnetic head 29. A recording magnetic gap 30 (composed of a nonmagnetic insulation material such as AlOx) and an upper recording magnetic pole 31 are formed on the lower recording magnetic pole 24 that is common with the upper magnetic shield layer. A recording coil (not shown) that applies a recording magnetic field to the lower recording magnetic pole 24 and the upper recording magnetic pole 31 is disposed on the rear side of the surface opposite to the medium. Thus, as a recording head, the thin film magnetic head 29 is structured.

The shield type GMR head 25 whose principal portions are shown in FIG. 2 is fabricated in the following manner.

The films composed the spin valve GMR film 14 is formed by the spatter method or the like on the main front surface of the substrate 11 of which up to the lower reproduction magnetic gap 13 has been formed. Next, with a photoresist mask, the spin valve GMR film 14 is etched out in a predetermined shape by the ion milling method or the like. In the etching step, at least up to the second ferromagnetic film 18 is removed in such a manner that part of a conductive film of the magnetic multi-layer film composing the spin valve GMR film 14 is left.

Next, with the photoresist that was used for etching the spin valve GMR film 14, the pair of hard magnetic films 20 and the pair of electrodes 21 are formed on the spin valve GMR film 14 corresponding to the outer portions of both the edge portions of the reproduction track by the spatter method or the like. The photoresist is removed with a solvent such as acetone.

Figure 4:
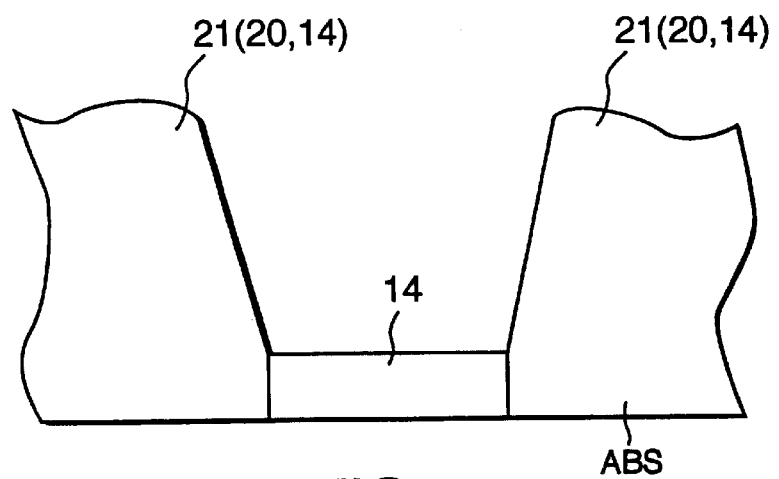
FIG. 4 is a sectional view showing the magnetoresistance effect device shown in FIG. 1.

Next, a photoresist mask corresponding to the shapes of the hard magnetic films 20 and the electrodes 21 is formed. Thereafter, with the photoresist mask, the hard magnetic films 20 and the electrodes 21 are ion-milled. Thus, a pattern as shown in FIG. 4 is formed. A conductive film of the magnetic multi-layer film that composes the spin valve GMR film 14 is present below the hard magnetic films 20 and the electrodes 21. Thereafter, the upper reproduction magnetic gap 23 and the upper magnetic shield layer 24 are formed. Thus, the shield type GMR head is obtained.

After the thin film magnetic head 29 as a recording head is formed on the shield type GMR head 25, the resultant structure is machined in a slider shape and then a head gimbal is assembled. Thus, the record/reproduction separation type magnetic head is obtained.

In the GMR head 25 of the above-described embodiment, the magnetization free layer, namely the second ferromagnetic film 18, is disposed on an upper side opposite to the substrate 11. Thus, firstly, since the magnetization free layer corresponding to the outer portions of both the edge portions of the reproduction track can be removed without need to completely remove the spin valve GMR film, a good off-track characteristic (low reproduction fringe) can be obtained. Consequently, a structure of which part of the conductive film is left at the outer portions of both the edge portions can be accomplished. Thus, with the resultant conductive film, a stable electric contact can be assured. As a result, a stable and small contact resistance can be accomplished. Thus, the resistance of the entire GMR reproducing device 22 can be decreased. Consequently, even if a large sense current is supplied and thereby the reproduction sensitivity is increased, the device is not subject to thermal noise.

Secondly, since at least only the second ferromagnetic film 18 that is the magnetization free layer is etched, the etching amount is small. Thus, the improvement of etching accuracy can be expected. Thirdly, the lower portion of the spin valve GMR film 14 that is progressively etched is lightly tapered. In contrast, the second ferromagnetic film 18 is sharply tapered. Thus, the taper region that causes Barkhausen noise can be reduced. As a result, the Barkhausen noise can be stably suppressed.

Fourthly, a bias magnetic field of the hard magnetic film 20 can be applied to the second ferromagnetic film 18 without need to contact the wall surfaces at the edge portions of the first ferromagnetic film 16 that is the fixed magnetization layer to the hard magnetic film 20. Thus, in addition to suppressing the Barkhausen noise, a leakage magnetic field of the hard magnetic film 20 to the fixed magnetization film can be suppressed. Thus, the problem of which the magnetization of the first ferromagnetic film 16 is inclined in the direction of the leakage magnetic field of the hard magnetic film 20 can be solved. The direction of the magnetization of the first ferromagnetic film 16 is stably fixed in the direction of the width of the spin valve GMR film 14 (in the direction to which the signal magnetic field is applied). Thus, a good linear response characteristic can be obtained.

Since the GMR head according to the embodiment has features that the off-track characteristic is good, that the reproduction fringe is small, that the Barkhausen noise and thermal noise are small, and that the linear response characteristic is high, a reproduction characteristic with a high SIN ratio can be accomplished.

In the above-described embodiment, the spin valve GMR film 14 that is composed of the basic magnetic multi-layer film having the antiferromagnetic film 15, the first ferromagnetic film 16, the non-magnetic film 17, and the second ferromagnetic film 18 was explained. However, the magnetic multi-layer film that composes the spin valve GMR film 14 can contain other layers depending on the structural material of each layer.

Figure 5:
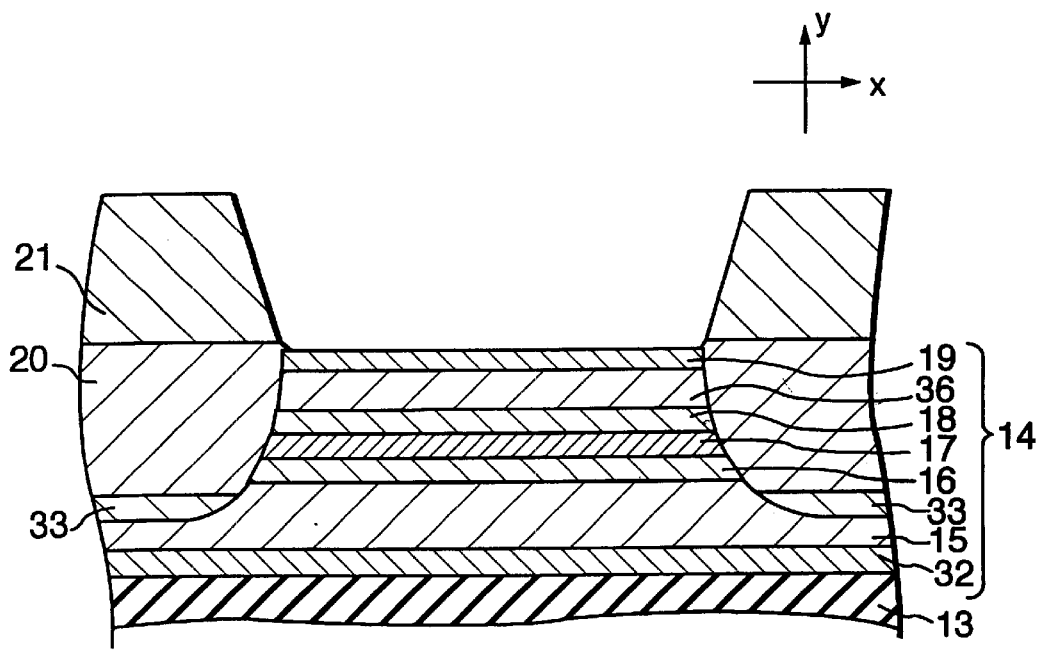
FIG. 5 is a sectional view showing a second modified example of the magnetoresistance effect device shown in FIG. 2.

In comparison with the conventional spin valve structure of which the magnetization free layer, the non-magnetic film, the fixed magnetization layer, and the antiferromagnetic film are formed in the order, according to the spin valve structure of the present invention (namely, these layers are reversely formed), when the antiferromagnetic film 15 that is composed of a metal alloy such as IrMn alloy or FeMn alloy is simply used, the bias magnetic field of the antiferromagnetic film 15 to the first ferromagnetic film 16 may weaken. Thus, as shown in FIG. 5, a base film 32 for the antiferromagnetic film 15 is preferably disposed so as to stabilize the fcc phase of antiferromagnetic film 15 and ferromagnetic films 16, 18 and improve the orientation characteristic of the (111) crystal of antiferromagnetic film 15. Examples of the material of the base film 32 may be Ta, Zr, Nb, Hf, or the like. In particular, as the material of the base film 32, NiFe alloy having the fcc phase, NiFeX alloy (where X is at least one element selected from the group consisting of Cr, Nb, Ta, Zr, Hf, W, Mo, V, Ti, Rh, Ir, Cu, Au, Ag, Mn, Re, and Ru), CuNi alloy, or the like is preferably used. The film thickness of the base film 32 is preferably in the range from 1 to 20 nm.

In particular, the antiferromagnetic film 15 that is composed of InMn alloy containing 5 to 40 % by weight of Ir and that is formed through the base film 32 has an excellent heat resistance (of which the blocking temperature TB at which a bias magnetic field disappears is 473 K or more), thereby providing a high bias magnetic field. The film thickness of the antiferromagnetic film 15 composed of IrMn alloy is preferably in the range from 3 to 30 nm. When the film thickness of the antiferromagnetic film 15 is smaller than this range, a sufficient bias magnetic field cannot be obtained. In contrast, when the film thickness of the antiferromagnetic film 15 is larger than the range, a branch current of the sense current to the antiferromagnetic film 15 increases, thereby decreasing the resistance change ratio.

When the antiferromagnetic film 15 is composed of a conductive material such as IrMn alloy or FeMn alloy, as shown the second modified example in FIG. 5, the spin valve GMR film 14 corresponding to the outer portions of both the edge portions of the reproduction track is etched out in such a manner that at least part of the antiferromagnetic film 15 is left. The hard magnetic film 20 may be formed on the conductive antiferromagnetic film 15. Even if the spin valve GMR film is etched in such a manner that up to the antiferromagnetic film 15 is exposed, the conductive film does not disappear. Thus, the contact resistance between the electrode 21 including the hard magnetic film 20 and the spin valve GXR film 14 can be decreased with high reproducibility.

On the other hand, when the antiferromagnetic film 15 is composed of for example NiO that is an insulation material, as shown in FIG. 1, both the first ferromagnetic film 16 and the nonmagnetic film 17 or only the first ferromagnetic film 16 as a conductive film of the spin valve GMR film 14 is disposed below the hard magnetic film 20. Thus, in comparison with the electric contact of the wall surface of the conventional structure, the electric contact between the electrode 21 containing the hard magnetic film 20 and the spin valve GMR film 14 can be improved.

In addition, as shown in FIG. 5, a base film 33 composed of Cr alloy, V alloy, CrV alloy, FeCo alloy or the like with a thickness of 1 to 20 nm is preferably disposed below the hard magnetic film 20 composed of CoPt alloy or the like so that the c axis of the hard magnetic film 20 is sufficiently inclined in the direction of the film surface and thereby a high coercive force is obtained.

A magnetic film with an intermediate lattice constant of those of the antiferromagnetic film 15 and the first ferromagnetic film 16 can be disposed there between so as to increase the exchange bias magnetic field from the antiferromagnetic film 15 to the first ferromagnetic film 16. When the antiferromagnetic film 15 is composed of FeMn alloy and the first ferromagnetic film 16 is composed of CoFe alloy, an example of the material of the magnetic film is CoFePd alloy. When the first ferromagnetic film 16 and the second ferromagnetic film 18 are composed of a Co based alloy such as CoFe alloy and CoFeB alloy, a very thin layer composed of a NiFe type material with a thickness of 0.5 to 3 nm can be disposed between the first ferromagnetic film 16 and the antiferromagnetic film 15. The very thin layer composed of the NiFe type material allows the fcc phase of the Co based alloy to become stable and thereby the coercive force of the Co based alloy to decrease. Thus, with this structure, a reproduction output with a high sensitivity and free of Barkhausen noise can be obtained.

Figure 6:
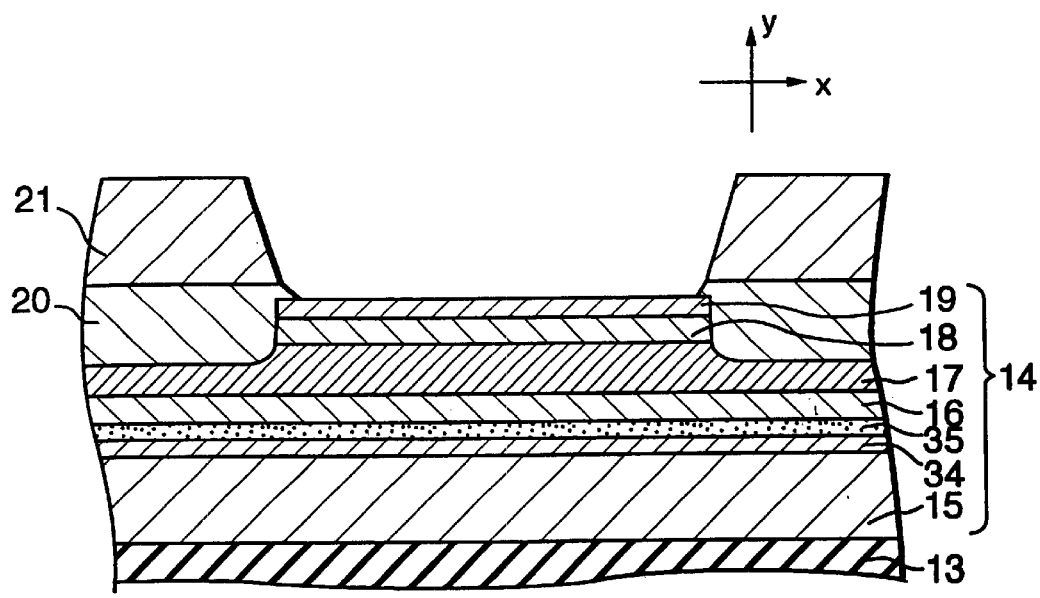
FIG. 6 is a sectional view showing a third modified example of the magnetoresistance effect device shown in FIG. 2.

In addition, as shown the third modified example in FIG. 6, a magnetic layer 34 composed of Ni, a Ni based alloy, or the like can be disposed between the antiferromagnetic film 15 and the first ferromagnetic film 16. In this case, the film thickness of the magnetic layer 34 is preferably in the range from 0.5 to 5 nm. In addition, a diffusion barrier layer 35 may be disposed between the first ferromagnetic film 16 and the magnetic layer 34. The diffusion barrier layer 35 allows the first ferromagnetic film 16 and the non-magnetic film 17 to densely grow. Thus, since an interface that is thermally stable is disposed between the first ferromagnetic film 16 and the non-magnetic film 17, a large resistance change ratio can be obtained. The diffusion barrier layer 35 can be obtained in such a manner that after the magnetic layer 34 is formed by the spatter method or the like, a small amount of oxygen (around 1 to 10 SCCM) is temporarily supplied to the spatter atmosphere (for 1 to 300 seconds) and the front surface of the magnetic layer 34 is oxidized with a thickness of 3 nm or less so that the exchange coupling is performed. The diffusion barrier layer 35 may be formed by nitridation treatment, fluoridation treatment, carbonization treatment, or the like. Alternatively, after the magnetic layer 34 is formed, it is temporarily exposed to air so as to form the diffusion barrier layer 35.

When the first ferromagnetic film 16 and the second ferromagnetic film 18 are composed of an alloy containing much Ni such as NiFe alloy and the non-magnetic film 17 is composed of Cu, a very thin Co or Co based alloy film with a film thickness of 1.'5 nm or less is preferably disposed at the interface with the non-magnetic film 17. Thus, a diffusion of Ni and Cu can be prevented. Consequently, the resistance change ratio and the heat resistance can be secured.

When necessary, a soft magnetic assist film 36 is formed on the second ferromagnetic film 18 as shown in FIG. 5. When the second ferromagnetic film 18 that is the magnetization free layer is composed of an alloy containing much Ni that has a soft magnetic characteristic, the soft magnetic assist layer 36 is not always required. When a Co based alloy such as CoFe alloy is used, the soft magnetic assist layer 36 is preferably formed. In this case, the soft magnetic assist layer 36 is composed of a crystal magnetic alloy such as NiFe alloy or NiFeX alloy (where X is at least one element selected from the group consisting of Cr, Nb, Ta, Zr, Hf, W, Mo, V, Ti, Rh, Ir, Cu, Au, Ag, Mn. Re, and Ru), amorphous magnetic alloy such as CoZrNb alloy, CoFeRe alloy, or CoFeAlO alloy, nitride fine crystal alloy such as FeZrN alloy or CoFeTaN alloy, carbide fine crystal alloy such as CoNbC or FeTaV, or a laminate film thereof.

The soft magnetic assist film 36 allows the soft magnetic characteristic of the second ferromagnetic film 18 composed of a Co based alloy to be improved. The film thickness of the soft magnetic assist film 36 is preferably in the range from 1 to 15 nm. The soft magnetic assist film 36 is preferably composed of a magnetic film with a high resistance so as to suppress a branch current of the sense current and maintain a high resistance change ratio. The magnetic film preferably has a resistance of 50 $\mu\Omega$m.

With respect to the shapes of the pair of the hard magnetic films 20 and the pair of the electrodes 21, in the following case, the distance between the hard magnetic films 20 matches the distance between the electrodes 21. In other words, with the resist mask used for patterning the spin valve GMR film 14, the soft magnetic films 20 and the electrodes 21 are successively formed. After the resist mask is removed (namely, it is lifted off), a resist mask corresponding to the shapes of the electrodes is formed and then etched by the ion milling method. In this case, the distance is almost equal to the width of the reproduction track.

Figure 7:
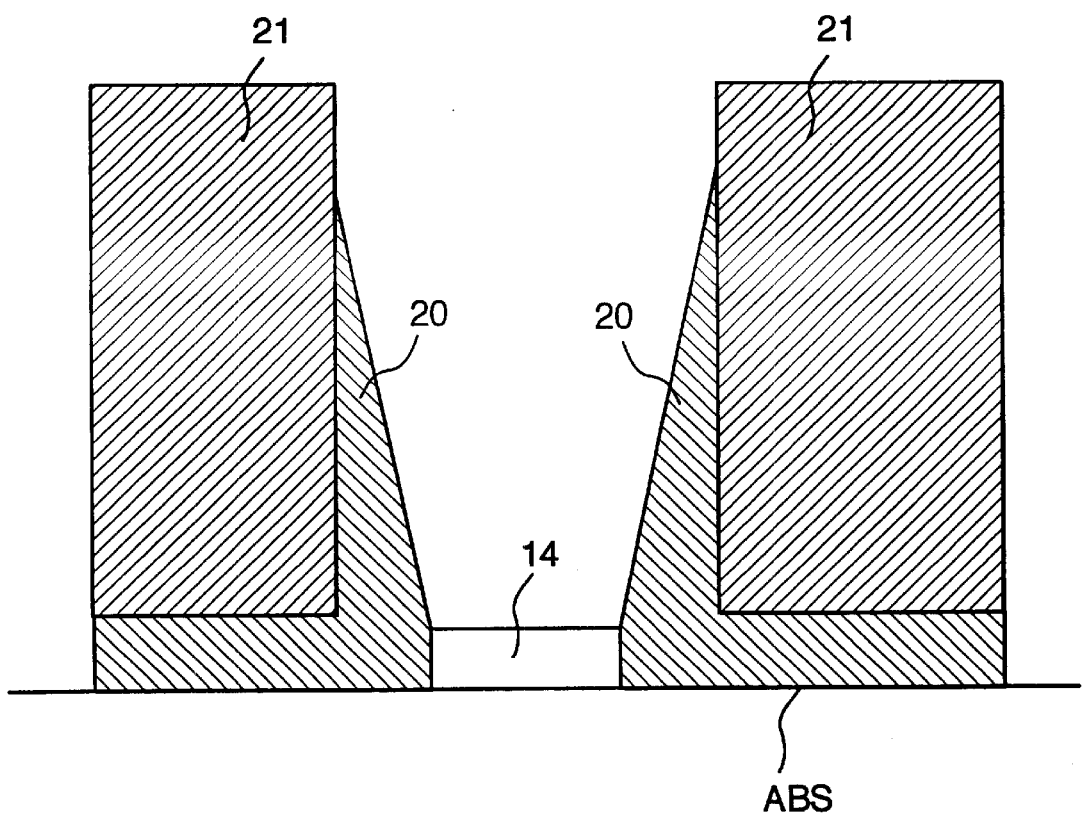
FIG. 7 is a sectional view showing a forth modified example of the magnetoresistance effect device shown in FIG. 2.

On the other hand, when the distance between the electrodes 21 is larger than the distance between the hard magnetic films 20, the hard magnetic film 20 can be used in common with part of the electrode in the vicinity of the spin valve GMR film 14. As shown in FIG. 7, the hard magnetic films 20 and the electrodes 21 can be separately formed so that the distance between the electrodes 21 is larger than the distance between the hard magnetic films 20 and thereby the electrodes 21 are disposed behind the surface opposite to the medium.

In such a structure, since the electrodes 21 are formed behind the surface opposite to the medium, in a machining step, the spin valve GMR film 14 is not exposed to the electrodes 21. In addition, even if a soft and low-resistance material such as Cu or Au is used for the electrodes 21, with an abrasion process, the electrodes 21 on the surface opposite to the medium widen, thereby preventing the deterioration of the electrodes that causes an insulation defect with the magnetic shield layers 12 and 14. In this case, since the hard magnetic film 20 is used in common with the electrode in the vicinity of the spin valve GMR film 14, the resistance of the hard magnetic film 20 is remarkably decreased. Thus, the film thickness of the hard magnetic film 20 is preferably increased. In reality, the film thickness of the hard magnetic film 20 is preferably in the range from 40 to 100 nm.

Figure 8:
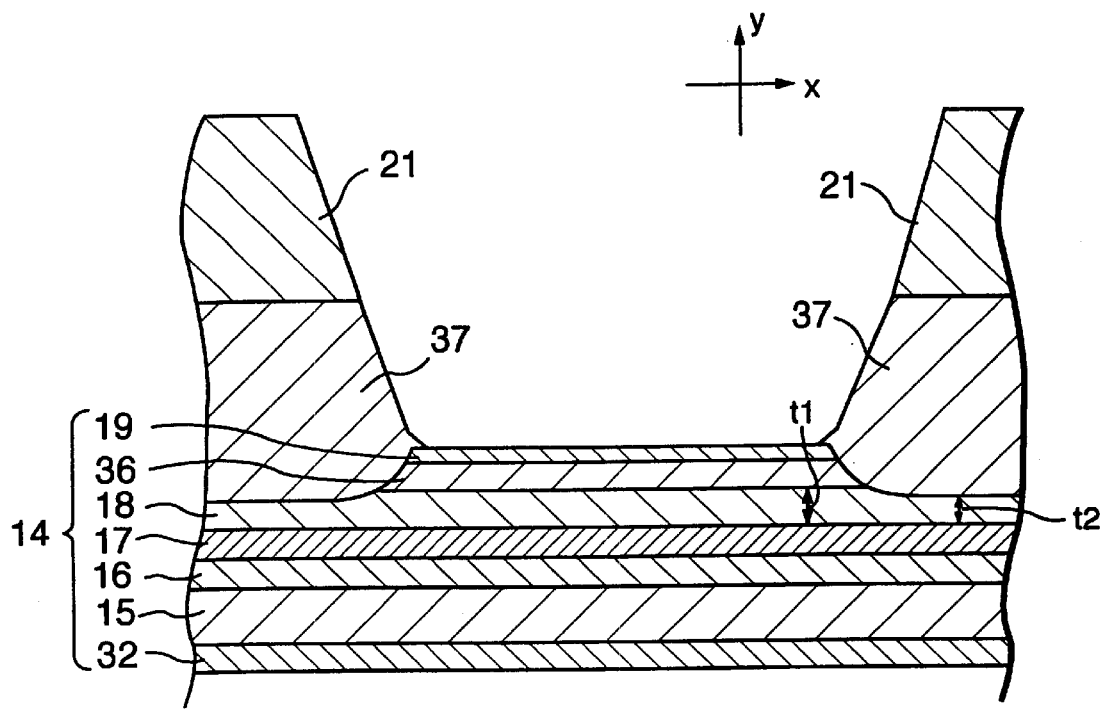
FIG. 8 is a sectional view showing the structure of principal portions of a magnetoresistance effect head to which a magnetoresistance effect device according to a second embodiment of the present invention is applied.

Next, with reference to FIG. 8, a GMR head to which a magnetoresistance effect device according to a second embodiment of the present invention is applied will be described. FIG. 8 is a sectional view showing principal portions of the GMR head having the magnetoresistance effect device according to this embodiment. The entire structure of the GMR head 25 is that same as that shown in FIG. 1. When the magnetoresistance effect device according to the second embodiment of the present invention is applied to a reproducing device and thereby a record/reproduction separation type magnetic head is structured, the entire structure thereof is the same as that shown in FIG. 1.

In the GMR head whose principal portions are shown in FIG. 8, as with the above-description, a spin valve GMR film 14 is composed of a magnetic multi-layer film having a base film 32, an antiferromagnetic film 15, a first ferromagnetic film 16, a non-magnetic film 17, a second ferromagnetic film 18, a soft magnetic assist film 36, and, a protection film 19 that are formed in the order on a substrate. The base film 32, the soft magnetic assist film 36, the protection film 19, and so forth are formed when necessary. In addition, as with the first embodiment, other layers may be disposed.

In the GMR head according to the second embodiment, the film thickness t2 of the second ferromagnetic film 18 at the outside portions of both the edge portions of the reproduction track is smaller than the film thickness $t_1$ the second ferromagnetic film 18 at the magnetic field detecting portion (reproduction track). A bias magnetic field applying film 37 is formed at the portions with the film thickness $t_2$ of the second ferromagnetic film 18 (namely, at the outer portions of both the edge portions of the reproduction track). In other words, the film thickness $t_2$ of the second ferromagnetic film 18 formed below the bias magnetic field applying film 37 is smaller than the film thickness $t_1$ of the second ferromagnetic film 18 at the magnetic field detecting portion. The electrodes 21 are formed on the bias magnetic field applying film 37.

When the magnetization free layer is composed of a laminate film of the second ferromagnetic film 18 and the soft magnetic assist film 36, the film thickness of the laminate film at the outer portions of both the edge portions of the reproduction track formed below the bias magnetic field applying film 37 may be smaller than the film thickness of the laminate film at the magnetic field detecting portion. The structure of the second embodiment other than the spin valve GMR film 14 is the same as the structure of the first embodiment.

In the GMR head according to the second embodiment, up to part of the second ferromagnetic film 18 that is the magnetization free layer is etched at the outer portions of both the edge portions of the reproduction track. Thus, the etching amount is small. Consequently, as well as the ion milling method, a simpler etching method such as reverse spatter etching method can be used.

The bias magnetic field applying film 37 is composed of a conductive antiferromagnetic film such as NiMn alloy, FeMn alloy, IrMn alloy, PdPtMn alloy, RhMn alloy, RuMn alloy, PtMn alloy, or CrMnPt alloy or a conductive soft magnetic film such as CoPt alloy. In addition, as with the structure shown in FIG. 3, the laminate film 28 of the ferromagnetic film 26 and the antiferromagnetic film 27 can be used for the bias magnetic field applying film 37.

When an antiferromagnetic film is used for the bias magnetic field applying film 37, the film thickness thereof is preferably in the range from 3 to 70 nm. In reality, when the antiferromagnetic film is composed of NiMn alloy, the film thickness thereof is preferably 25 nm or more. When the antiferromagnetic film is composed of FeMn alloy, the film thickness thereof is preferably 5 nm or more. When the antiferromagnetic film is composed of IrMn alloy, the film thickness thereof is preferably 3 nm or more. When the antiferromagnetic film is composed of PdPtMn alloy, the film thickness thereof is preferably 5 nm or more. Thus, a stable exchange bias can be obtained.

Figure 9:
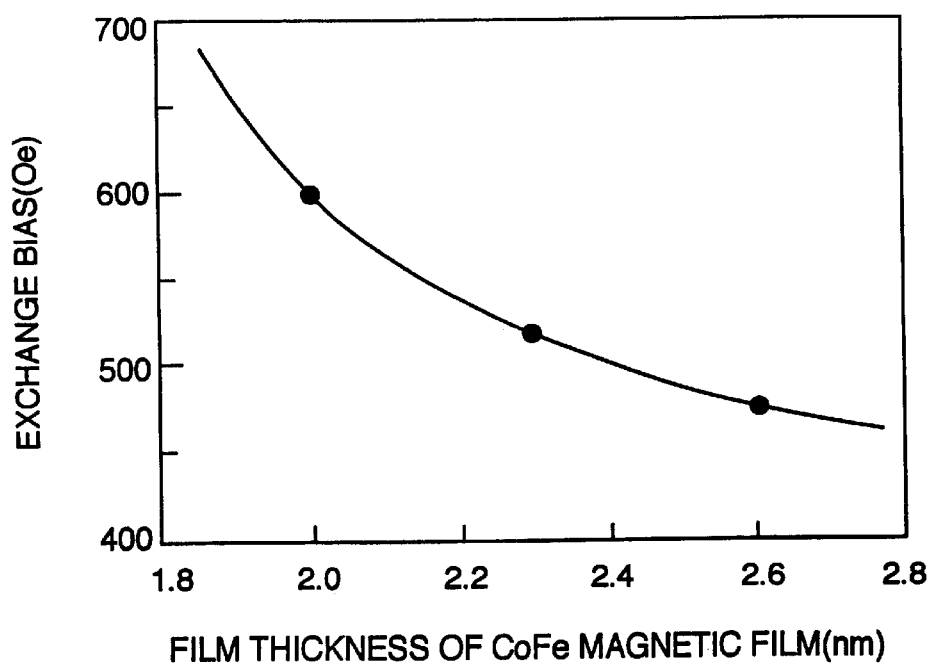
FIG. 9 is a schematic diagram showing an example of the relation between the film thickness of a magnetic film that applies an exchange bias of an antiferromagnetic film and exchange bias.

FIG. 9 shows the relation between the film thickness of the magnetic film to which the antiferromagnetic film such as IrMn alloy applies an exchange bias and the exchange bias. Referring to FIG. 9, when the film thickness of the magnetic film decreases, the exchange bias sharply increases. This relation applies to other antiferromagnetic films. Thus, the film thickness of the magnetization free layer (namely, the second ferromagnetic film 18 or the laminate layer of the second ferromagnetic film 18 and the soft magnetic assist film 36) disposed below the antiferromagnetic film as the bias magnetic field applying film 37 is decreased at the outer portions of both the edge portions of the reproduction track, the exchange bias can be increased.

In reality, the film thickness of the magnetization free layer disposed below the antiferromagnetic film as the bias magnetic field applying film 37 is preferably in the range from 2 to 5 nm. Thus, the change of the magnetization just below the antiferromagnetic film 37 due to the signal magnetic field of the medium becomes almost 0. Thus, the reproduction fringe can be decreased. In addition, a proper bias magnetic field is applied to the second ferromagnetic film 18 as the magnetization free layer. Thus, the Barkhausen noise can be stably suppressed.

When an antiferromagnetic film is used for the bias magnetic field applying film 37, a ferromagnetic film or an antiferromagnetic film with an intermediate lattice constant of those of the antiferromagnetic film (as the bias magnetic field applying film 37) and the second ferromagnetic film 18 or the soft magnetic assist film is preferably disposed there between so as to increase the intensity of the exchange bias. For example, when CoFe alloy is used for the second ferromagnetic film 18 and FeMn alloy as an antiferromagnetic film is used for the bias magnetic field applying film 37, an intermediate ferromagnetic film of which an additive element such as Pd is added to CoFe (where the lattice constant of the intermediate ferromagnetic film is close to that of FeMn alloy) is preferably disposed between the second ferromagnetic film 18 and the bias magnetic field applying film 37.

On the other hand, when a hard magnetic film is used for the bias magnetic field applying film 37, the total magnetical film thickness of the hard magnetic film and is the magnetization free layer (namely, the second ferromagnetic film 18 or the laminate film of the second ferromagnetic film 18 and the soft magnetic assist film 36) disposed below the hard magnetic film preferably twice or more the magnetical film thickness of the magnetization free layer. The magnetical film thickness is represented by the product of the residual magnetization Mr and the film thickness t (namely, Mr x t). When the magnetical film thickness of the magnetization free layer relatively increases, the reaction thereof causes the magnetization of the hard magnetic film to be unstable (in reality, the coercive force to decrease). Thus, the magnetization of the magnetization free layer due to the exchange coupling with the hard magnetic film becomes unstable. In other words, when the film thickness of the magnetization free layer disposed below the hard magnetic film as the bias magnetization applying film 37 is decreased, the magnetization of the magnetization free layer at the portion becomes very stable. Thus, the reproduction fringe can be decreased. The bias magnetization applying film 37 composed the laminate film 28 is that same.

For example, in the case that CoPt alloy (Mr=1 T) is used for the bias magnetic field applying film 37 and CoFe alloy (Mr=1.8 T) is used for the second ferromagnetic film 18, when the film thickness of the CoPt alloy film is 18 nm and the film thickness of the CoFe alloy film is 10 nm, the product Mr×t of the CoPt alloy film is almost the same as the product Mr×t of the CoFe alloy film. When the CoPt alloy film is formed on the CoFe alloy film, the coercive force of 1500 Oe of the CoPt alloy film is decreased to 700 Oe that is around ½ of the original coercive force. When the film thickness of the CoFe alloy film is Mr×t=2 (4 nm) (the film thickness of the CoPt film is also 4 nm), the coercive force of the laminate film with the CoFe alloy film is 1050 Oe. Thus, the coercive force does not remarkably decrease. The bias magnetic field applying film 37 may be the film laminated the antiferromagnetic film and the ferromagnetic film.

When a hard magnetic film is used for the bias magnetic field applying film 37, the c axis of the Co type hard magnetic film is oriented in the direction perpendicular to the film surface due to an epitaxial crystal growth of the second ferromagnetic film 18. Thus, the coercive force of the hard magnetic film may decrease. In this case, an amorphous type layer with a film thickness of I to 10 nm is preferably disposed between the second ferromagnetic film 18 and the hard magnetic film as the bias magnetic applying film 37 so as to suppress the coercive force of the hard magnetic film from decrease. An example of the amorphous type layer is Cr layer. In the Cr layer, a first layer of 2 nm. is amorphous, and a second layer of 3 nm is crystalline.

In the GMR head according to the second embodiment, when the bias magnetic field applying film is patterned, unlike with the conventional spin valve film of which the magnetization free layer is disposed on the substrate side, the surface characteristic of the base film of the spin valve film can be prevented from being deteriorated. Thus, stable characteristics of the-spin valve film can be accomplished.

When the film thickness of the magnetization free layer at the outer portions of both the edge portions of the reproduction track is smaller than the film thickness of the magnetization free layer at the magnetic field detecting portion, for the bias magnetic applying film composed of an antiferromagnetic film, the increase of the exchange bias force can be expected. For the bias magnetization applying film composed of the hard magnetic film, the increase of the coercive force can be expected. Thus, the magnetization of the magnetization free layer at the edge portions of the track can be more stably fixed. Consequently, the Barkhausen noise can be easily suppressed.

Moreover, when the bias magnetic field of the hard magnetic film is applied, since it does not directly contact the fixed magnetization layer with a wall surface, the direction of magnetization of the fixed magnetization layer is not disturbed by a leakage magnetic field of the hard magnetic film. Thus, a signal can be reproduced with an excellent linear response and free of the Barkhausen noise.

Figure 10:
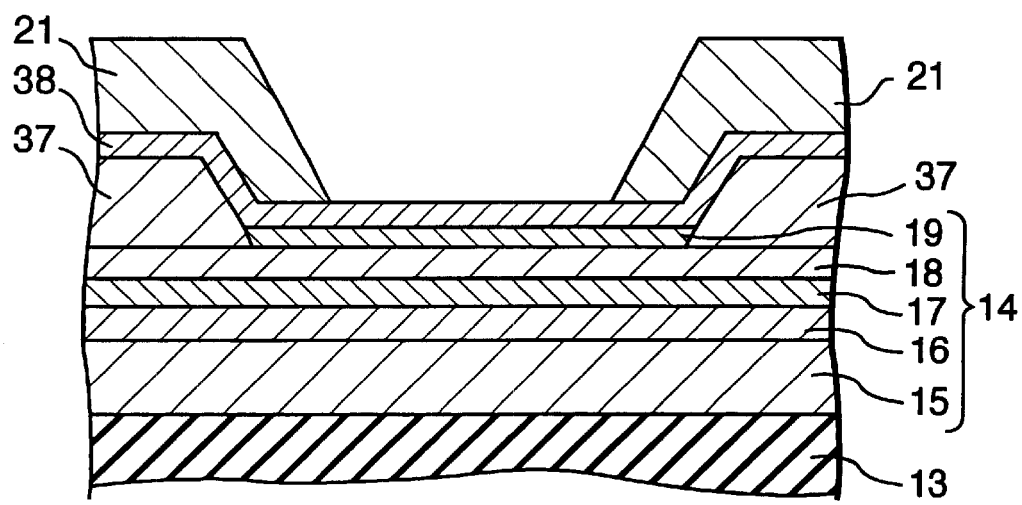
FIG. 10 is a sectional view showing the structure of principal portions of a magnetoresistance effect head to which a magnetoresistance effect device according to a third embodiment of the present invention is applied.

Next, with reference to FIG. 10, a GMR head to which a magnetoresistance effect device according to a third embodiment of the present invention is applied will be described. FIG. 10 is a sectional view showing principal portions of the GMR head having the magnetoresistance effect device according to the third embodiment. The entire structure of the GMR head shown in FIG. 10 is the same as that shown in FIG. 1. When the magnetoresistance effect device according to the third embodiment of the present invention is applied to a reproducing device and thereby a record/reproduction separation type magnetic head is structured, the entire structure thereof is the same as that shown in FIG. 1.

In the GMR head whose principal portions are shown in FIG. 10, as with the above-described embodiments, the spin valve GMR film 14 is composed of a magnetic multi-layer film having an antiferromagnetic film 15, a first ferromagnetic film 16, a non-magnetic film 17, a second ferromagnetic film 18, and a protection film 19 formed in the order on a substrate. In addition, as with the above-described embodiments, the spin valve GMR film 14 may have other layers.

Antiferromagnetic films as a pair of bias magnetic field applying films 37 are disposed on a second ferromagnetic film 18 at outer portions of both edge portions of a magnetic field detecting portion (reproduction track) of the spin valve GMR film 14. The bias magnetic field applying film 37 is composed of an antiferromagnetic film with a different blocking temperature from that of the antiferromagnetic film 15. As with the second embodiment, the portions of the bias magnetic field applying films 37 at the outer portions of both the edge portions of the reproduction track may be etched until part of the second ferromagnetic film 18 is exposed. The same ferromagnetic films as the second ferromagnetic film 18 may be formed as base films of the bias magnetic field applying films 37 at the portions of which the film thickness is decreased.

As with the second embodiment, the second ferromagnetic film 18 preferably has*a film thickness that allows an exchange bias of the bias magnetic field applying films 37 to increase. In reality, the film thickness of the second ferromagnetic film 18 is preferably in the range from 2 to 10 nm. In addition, the film thickness of the antiferromagnetic film as the bias magnetic field applying film 37 is preferably the same as that of the second embodiment.

A high resistance protection film 38 composed of Ti or the like is formed on the spin valve GXR film 14 and the bias magnetic field applying film 37. A pair of electrodes 21 are formed on the high resistance protection film 38. The pair of electrodes 21 are patterned so that the distance thereof is smaller than the distance between the pair of bias magnetic field applying films 37. When the electrodes 21 are patterned by the ion milling method, RIE method, or the like, the high resistance protection film 38 functions as an etching stopper. Thus, the high resistance protection film 38 prevents the spin valve GMR film 14 from being excessively etched.

When the distance between the pair of electrodes 21 is smaller than the distance between the pair of bias magnetic field applying films 37, the distance between the pair of electrodes 21 defines the track width. In this structure, since low sensitivity regions in the vicinity of the bias magnetic field applying films 37 are removed, a high sensitive reproduction output with a narrow track width can be obtained. While the bias magnetic field applying films 37 are being formed, the electrodes 21 are formed and then patterned by the lift-off method. In this case, the distance between the pair of bias magnetic field applying films 37 is almost the same as the distance between the pair of electrodes 21.

In the GMR head according to the third embodiment, unlike with the conventional spin valve film of which the magnetization free layer is disposed on the substrate side, when the bias magnetic field applying films are patterned, the surface characteristic of the base film of the spin valve film can be prevented from deteriorating. In addition, when the electrodes 21 are patterned, the high resistance protection film 38 can prevent the spin valve GMR film 14 from being excessively etched. Thus, stable characteristics of the spin valve film can be accomplished.

When the film thickness of the second ferromagnetic film 18 as the magnetization free layer is decreased, the exchange bias force of the bias magnetic field applying films 37 composed of the antiferromagnetic films can be increased. Thus, the magnetization free layer is stably magnetized and the Barkhausen noise is suppressed. Consequently, a signal can be reproduced with an excellent linear response characteristic free of the Barkhausen noise.

In the first to third embodiments, examples of which the magnetoresistance effect device according to the present invention is applied to a reproducing device of a record/ reproduction separation type magnetic head were described. However, the magnetoresistance effect device according to the present invention is not limited to such embodiments. In other words, the magnetoresistance effect device according to the present invention can be applied to another head structure—of a record/reproduction integration type magnetic head of which a pair of magnetic yokes are shared by a recording head and a reproducing head.

Next, a magnetic storing apparatus such as a magnetoresistance effect random access memory (MRAM) to which a magnetoresistance effect device according to the present invention is applied will be described.

Figure 11:
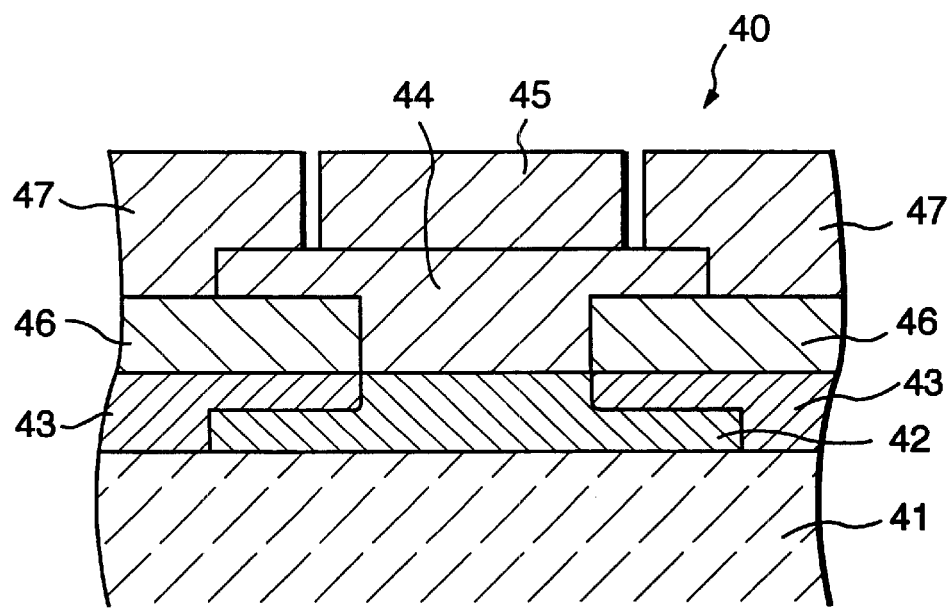
FIG. 11 is a sectional view showing the structure of principal portions of a magnetic storing apparatus to which the magnetoresistance effect device according to the present invention is applied.
Figure 12:
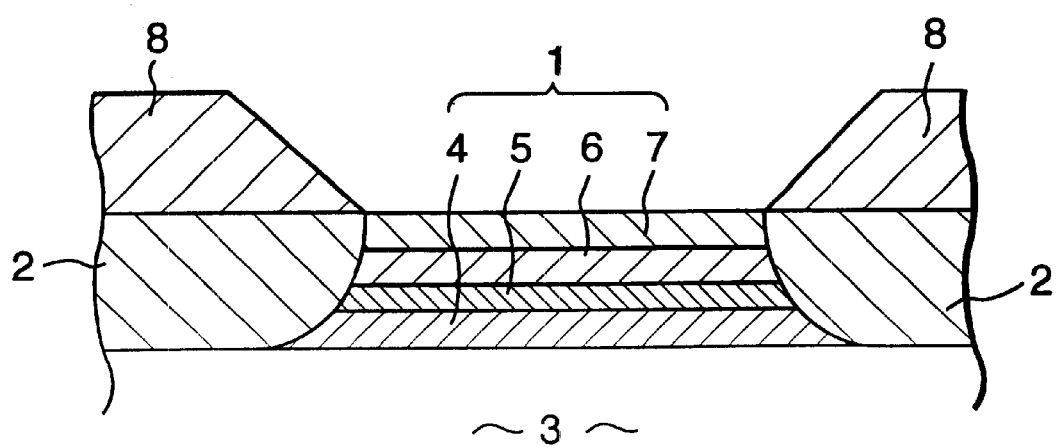
FIG. 12 is a sectional view showing an example of the structure of a conventional magnetoresistance effect head.

FIG. 11 is a sectional view showing the structure of an MRAM using giant magnetoresistance effect (GMR) according to an embodiment of the present invention. The MRAM 40 shown in FIG. 11 has a spin valve GMR film 42 formed on a substrate 41 such as a glass substrate or an Si substrate. The spin valve GMR film 42 has a reverse laminate structure as with the GMR heads according to the above-described embodiments. The spin valve GMR film 42 has a pair of bias magnetic field applying films 43 disposed at the outer portions of both the edge portions of the-reproduction track. The laminate structure of the spin valve GMR film 42 and the bias magnetic field applying films 43 is the same as the laminate structure shown in FIGS. 2, 3, 5, 6, 8, and 9.

A write electrode 45 is disposed on the spin valve GMR film 42 through an insulation layer 44. A pair of read electrodes 46 are disposed at both edge portions of the spin valve GMR film 42. A sense current is supplied from the pair of read electrodes 46 to the spin valve GMR film 42. In FIG. 11, reference numeral 47 is a pair of auxiliary read electrodes.

Information is read and written from/to the MRAM 40 in the following manner. When information is written, a current is supplied to the write electrode 45 and thereby an external magnetic field is applied in such a manner that the direction of the magnetization of the fixed magnetization layer is treated as data "1'- or 1-011.

When information is read, while a sense current is being supplied from the read electrodes 46, a positive/negative pulse current is supplied to the write electrode 45 and the resultant magnetic field of the current causes the direction of the magnetization of the magnetization free layer to be reversed. The direction of the magnetization of the magnetization free layer is not changed regardless of data I'11, or 110" of the magnetization of the fixed magnetization layer. on the other hand, depending on the direction of the magnetization of the fixed magnetization layer 50 stored as data "1", or "0", when the pulse current of the write electrode 45 is positive, the directions of the magnetization of the upper and lower ferromagnetic layers of the spin valve GXR film 42 are in parallel or not in parallel. Thus, when a pulse current that varies from positive to negative is supplied to the write electrode 45, depending on whether the resistance of the sense current decreases or increases, data I'11, or "Of of the fixed magnetization layer is determined.

The bias magnetic field applying film 43 of the MRAM 40 controls the intensity of the magnetic field of which the magnetization reversal of the magnetization free layer takes place when a positive/negative pulse current is supplied to the write electrode 45. Alternatively, the bias magnetic field applying films 43 suppresses the noise due to irregular magnetization reversal in the state that a magnetic domain is formed. The bias magnetic field applying film should be a thin film corresponding to high integration of the final product and have a bias force that sufficiently suppresses the increase of the anti-magnetization corresponding to a small cell size. As described in the first to third embodiments, with the bias magnetic field applying films according to the present invention, a sufficient bias force can be obtained. Thus, the high integration of the MRAM 40 can be accomplished.

As is clear from the above-described embodiments, according to the magnetoresistance effect device of the present invention, in adding to suppressing the reproduction fringe and Barkhausen noise, the decrease of contact resistance, the suppression of insulation defect, and high liner response characteristic can be accomplished.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A magnetoresistance effect device, comprising a magnetoresistance effect film, the magnetoresistance effect film having:
    an antiferromagnetic film;
    a first ferromagnetic film disposed on the antiferromagnetic film;
    an intermediate layer including at least one chosen from an oxide, a nitride, a carbide, and a fluoride, of a material of the first ferromagnetic film, being disposed on the first ferromagnetic film;
    a second ferromagnetic film disposed on the intermediate layer, wherein the magnetization direction of the second ferromagnetic film is substantially fixed;
    a non-magnetic film disposed on the second ferromagnetic film; and a third ferromagnetic film disposed on the non-magnetic film, wherein the magnetization direction of a part of the third ferromagnetic film is free to rotate in an applied magnetic field, the second ferromagnetic film is exchange coupled with the first ferromagnetic film via the intermediate layer.

2. The magnetoresistance effect device as set forth in claim 1, wherein the antiferromagnetic film consists essentially of an alloy selected from the group consisting of PtMn, IrMn, PdPtMn, NiMn, RuMn, FeMn, RhMn, and CrMnPt.

3. The magnetoresistance effect device as set forth in claim 1, further comprising a layer disposed on the antiferromagnetic film opposite to the first ferromagnetic film, the layer consisting essentially of NiFeX where X is at least one element chosen from Cr, Nb, Zr, Hf, W, Mo, V, Ti, Rh, Ir, Cu, Au, Ag, Mn, Re, and Ru.

4. The magnetoresistance effect device as set forth in claim 1, wherein the intermediate layer has a thickness less than or equal to 3 nanometers.

5. The magnetoresistance effect device as set forth in claim 1, further comprising:

a pair of hard magnetic films disposed adjacent to respective edge portions of a magnetic field detecting portion of the magnetoresistance effect film, and disposed on a film chosen from the antiferromagnetic film, the first ferromagnetic film, the second ferromagnetic film, and the non-magnetic film; and a pair of electrodes coupled to the magnetoresistance effect film.

6. The magnetoresistance effect device as set forth in claim 1, further comprising:

a pair of second antiferromagnetic films disposed adjacent to respective edge portions of a magnetic field detecting portion of the magnetoresistance effect film, and disposed on a film chosen from the antiferromagnetic film, the first ferromagnetic film, the second ferromagnetic film, and the non-magnetic film; and a pair of electrodes coupled to the magnetoresistance effect film.

7. The magnetoresistance effect device as set forth in claim 1, further comprising a second antiferromagnetic film, wherein the second antiferromagnetic film is provided adjacent to the outer portions of the third ferromagnetic film in a track width direction, and the second antiferromagnetic film being exchanged coupled with outer portions of the third ferromagnetic film.

8. The magnetoresistance effect device as set forth in claim 1, wherein the antiferromagnetic film is disposed on a substrate, the first ferromagnetic film is disposed over the antiferromagnetic film, the second ferromagnetic film is disposed over the first ferromagnetic film, the non-magnetic film is disposed over the second ferromagnetic film, and the third ferromagnetic film is disposed over the non-magnetic ferromagnetic film.

9. A magnetic head, comprising a magnetoresistance effect device having a magnetoresistance effect film, the magnetoresistance effect film including:

an antiferromagnetic film;

a first ferromagnetic FILM disposed on the antiferromagnetic film;

an intermediate layer including at least one chosen from an oxide a nitride, a carbide, and a fluoride, of a material of the first ferromagnetic film;

a second ferromagnetic film disposed on the intermediate layer, wherein the magnetization direction of the second ferromagnetic film is substantially fixed;

a non-magnetic film disposed on the second ferromagnetic film; and a third ferromagnetic film disposed on the non-magnetic film, wherein the magnetization direction of the third ferromagnetic film is free to rotate in an applied magnetic field, the second ferromagnetic film is exchange coupled with the first ferromagnetic film via the intermediate layer.

10. The magnetic head as set forth in claim 9, further comprising:

a first reproduction magnetic gap layer provided under the magnetoresistance effect film;

a first magnetic shield layer provided under the first reproduction magnetic gap layer;

a second reproduction magnetic gap layer provided on the magnetoresistance effect film; and a second magnetic shield layer provided on the second reproduction magnetic gap layer.

11. The magnetic head as set forth in claim 10, further comprising:

a record magnetic gap provided on the second magnetic shield layer; and a second magnetic pole provided on the record magnetic gap, the second magnetic shield layer being in common with a first magnetic pole, a portion from the first magnetic shield layer to the second magnetic shield being configured to operate as a reproducing head, and a portion from the first magnetic pole to the second magnetic pole being configured to operate as a recording head.

12. A magnetic storing apparatus, comprising:

a magnetoresistance effect device having a magnetoresistance effect film, a write electrode configured to write information by applying a current magnetic field to the magnetoresistance effect device;

a read electrode composed of an electrode of the magnetoresistance effect device, the read electrode being configured to reproduce the information stored in the magnetoresistance effect film, the magnetoresistance effect film including:

an antiferromagnetic film;

a first ferromagnetic film disposed on the antiferromagnetic film;

an intermediate layer including at least one chosen from an oxide, a nitride, a carbide, and a fluoride, of a material of the first ferromagnetic film, being disposed on the first ferromagnetic film;

a second ferromagnetic film disposed on the intermediate layer, wherein the magnetization direction of the second ferromagnetic film is substantially fixed;

a non-magnetic film disposed on the second ferromagnetic film; and a third ferromagnetic film disposed on the non-magnetic film, wherein the magnetization direction of the third ferromagnetic film is free to rotate in an applied magnetic field, the second ferromagnetic film is exchange coupled with the first ferromagnetic film via the intermediate layer.

13. A magnetoresistance effect device, comprising a magnetoresistance effect film, the magnetoresistance effect film having:

an antiferromagnetic film;

a first ferromagnetic film disposed on the antiferromagnetic film;

an intermediate layer disposed on the first ferromagnetic film, the intermediate layer formed by at least one of oxidation, nitridation, carbonization and fluoridation treatment of a surface of the first ferromagnetic film;

a second ferromagnetic film disposed on the intermediate layer, a magnetization direction of the second ferromagnetic film being substantially fixed;

a non-magnetic film disposed on the second ferromagnetic film; and a third ferromagnetic film disposed on the non-magnetic film, a magnetization direction of at least a part of the third ferromagnetic film being free to rotate in an applied magnetic field.

14. The magnetoresistance effect device as set forth in claim 13, wherein the antiferromagnetic film consists essentially of an alloy selected from the group consisting of PtMn, IrMn, PdPtMn, NiMn, RuMn, FeMn, RhMn, and CrMnPt.

15. The magnetoresistance effect device as set forth in claim 13, further comprising a layer disposed on the antiferromagnetic film opposite to the first ferromagnetic film, the layer consisting essentially of NiFeX where X is at least one element chosen from Cr, Nb, Zr, Hf, W, Mo, V, Ti, Rh, Ir, Cu, Au, Ag, Mn, Re, and Ru.

16. The magnetoresistance effect device as set forth in claim 13, wherein the intermediate layer has a thickness less than or equal to 3 nanometers.

17. The magnetoresistance effect device as set forth in claim 13, further comprising:

a pair of hard magnetic films disposed adjacent to respective edge portions of a magnetic field detecting portion of the magnetoresistance effect film, and disposed on a film chosen from the antiferromagnetic film, the first ferromagnetic film, the second ferromagnetic film, and the non-magnetic film; and a pair of electrodes coupled to the magnetoresistance effect film.

18. The magnetoresistance effect device as set forth in claim 13, further comprising:

a pair of second antiferromagnetic films disposed adjacent to respective edge portions of a magnetic field detecting portion of the magnetoresistance effect film, and disposed on a film chosen from the antiferromagnetic film, the first ferromagnetic film, the second ferromagnetic film, and the non-magnetic film; and a pair of electrodes coupled to the magnetoresistance effect film.

19. The magnetoresistance effect device as set forth in claim 13, further comprising a second antiferromagnetic film, wherein the second antiferromagnetic film is provided adjacent to the outer portions of the third ferromagnetic film in a track width direction, and the second antiferromagnetic being exchange coupled with outer portions of the third ferromagnetic film.

20. The magnetoresistance effect device as set forth in claim 13, wherein the antiferromagnetic film is disposed on a substrate, the first ferromagnetic film is disposed over the antiferromagnetic film, the second ferromagnetic film is disposed over the first ferromagnetic film, the non-magnetic film is disposed over the second ferromagnetic film, and the third ferromagnetic film is disposed over the non-magnetic ferromagnetic film.

21. A magnetic head, comprising a magnetoresistance effect device having a magnetoresistance effect film, the magnetoresistance effect film including:

an antiferromagnetic film;

a first ferromagnetic film disposed on the antiferromagnetic film;

an intermediate layer disposed on the first ferromagnetic film, the intermediate layer formed by at least one of oxidation, nitridation, carbonization, and fluoridation treatment, of a surface of the first ferromagnetic film;

a second ferromagnetic film disposed on the intermediate layer, wherein a magnetization direction of the second ferromagnetic film is substantially fixed;

a non-magnetic film disposed on the second ferromagnetic film; and a third ferromagnetic film disposed on the non-magnetic film, wherein a magnetization direction of at least a part of the third ferromagnetic film is free to rotate in an applied magnetic field.

22. The magnetic head as set forth in claim 21, further comprising:

a first reproduction magnetic gap layer provided under the magnetoresistance effect film;

a first magnetic shield layer provided under the first reproduction magnetic gap layer;

a second reproduction magnetic gap layer provided on the magnetoresistance effect film; and a second magnetic shield layer provided on the second reproduction magnetic gap layer.

23. The magnetic head as set forth in claim 21, further comprising:

a record magnetic gap provided on the second magnetic shield layer; and a second magnetic pole provided on the record magnetic gap, the second magnetic shield layer being in common with a first magnetic pole, a portion from the first magnetic shield layer to the second magnetic shield being configured to operate as a reproducing head, and a portion from the first magnetic pole to the second magnetic pole being configured to operate as a recording head.

24. A magnetic storing apparatus, comprising:

a magnetoresistance effect device having a magnetoresistance effect film, a write electrode configured to store information to the magnetoresistance effect film of the magnetoresistance effect device;

a read electrode composed of an electrode of the magnetoresistance effect device, the read electrode being configured to reproduce the information stored in the magnetoresistance effect film, the magnetoresistance effect film including:

an antiferromagnetic film;

a first ferromagnetic film disposed on the antiferromagnetic film;

an intermediate layer disposed on the first ferromagnetic film, the intermediate layer formed by at least one of oxidation, nitridation, carbonization, and fluoridation treatment, of a surface of the first ferromagnetic film, being disposed on the first ferromagnetic film;

a second ferromagnetic film disposed on the intermediate layer, wherein the magnetization direction of the second ferromagnetic film is substantially fixed;

a non-magnetic film disposed on the second ferromagnetic film; and a third ferromagnetic film disposed on the non-magnetic film, wherein the magnetization direction of the third ferromagnetic film is free to rotate in an applied magnetic field.

* * * * *